United States Patent [19]

Fisher

[11] Patent Number: 5,546,068
[45] Date of Patent: Aug. 13, 1996

[54] SENSE AMPLIFIER

[75] Inventor: Aaron L. Fisher, Allentown, Pa.

[73] Assignee: AT&T Corp., Murray Hill, N.J.

[21] Appl. No.: 362,688

[22] Filed: Dec. 22, 1994

[51] Int. Cl.[6] .................................................... H03F 3/45
[52] U.S. Cl. ........................ 340/146.2; 327/51; 327/63; 365/104
[58] Field of Search .............................. 365/104; 327/51, 327/56, 63, 68; 340/146.2

[56] References Cited

U.S. PATENT DOCUMENTS

| | | | |
|---|---|---|---|
| Re. 32,401 | 2/1981 | Beilstein, Jr. et al. | 365/182 |
| 3,963,908 | 6/1976 | Das | 235/153 AM |
| 4,287,568 | 9/1981 | Lester | 364/900 |
| 5,272,674 | 9/1992 | Pathak et al. | 365/206 |
| 5,293,560 | 11/1992 | Harari | 365/185 |
| 5,363,340 | 11/1994 | Ishikawa et al. | 365/104 |
| 5,467,300 | 11/1995 | Komarek et al. | 365/104 |

OTHER PUBLICATIONS

Travis N. Blalock, Richard C. Jaeger, A High–Speed Clamped Bit–Line Current–ModeSense Amplifer, IEEE Journal of Solid–State Circuits, vol. 26, No. 4, Apr. 1991.
Takeshi Nakayama et al, A 60–ns 16–Mb Flash EEPROM with Program and Erase Sequence Controller, IEEE Journal of Solid–State Circuits, vol. 26, No. 11, Nov. 1991.
Koichi Seki et al, An 80–ns 1Mb Flash Memory with On–Chip Erase/Erase–Verify Controller, IEEE Journal of Solid–State Circuits, vol. 25, No. 5, Oct. 1990.
Kazuyoshi Shohji et al, A Novel Automatic Erase Technique Using an Internal Voltage Generator for 1Mbit Flash EEPROM, IEEE 1990 Symposium on VLSI Circuits.
Richard D. Pashley et al, Flash Memories: The Best of Two Worlds, IEEE Spectrum, Dec. 1989.
Tomohau Tanaka et al, A Quick Intelligent Program Architecture for 3V–Only NAND–EEPROMs, 1992 Symposium on VLSI Circuits Digest of Technical Papers.

*Primary Examiner*—Margaret Rose Wambach
*Attorney, Agent, or Firm*—David L. Smith

[57] ABSTRACT

There is disclosed an integrated circuit including a sense amplifier. The sense amplifier is capable of encoding $2^n$ levels of output characteristic into a bit pattern of n corresponding bits. The sense amplifier includes a non-zero detect circuit for detecting when the output characteristic is zero. The sense amplifier also includes $2^n-2$ comparators for comparing an output characteristic to $2^n-2$ reference levels when the output characteristic is non-zero. The $2^n-2$ reference levels are constructed from $2^n-2$ non-zero levels of the $2^n$ possible levels of output characteristic. An encoder is coupled to the non-zero detect circuit and the comparators. The encoder encodes the output from the non-zero detect circuit and the outputs from the comparators to corresponding predetermined bit patterns. When the output characteristic is determined to be zero by the non-zero detect circuit, the bit pattern output is a default bit pattern. When the output characteristic is non-zero, the bit pattern takes on predetermined values determined by which pair of reference levels the output falls between, or whether the output characteristic is greater than the largest reference level or less than the smallest reference level.

11 Claims, 4 Drawing Sheets

5,546,068

SENSE AMPLIFIER

TECHNICAL FIELD

This invention relates generally to read-only memory (ROM) and more particularly to a sense amplifier for use with multiple level memories such as multiple level ROM or multiple level EEPROM.

BACKGROUND OF THE INVENTION

ROM is used to store data that are used repeatedly in a system application. Such applications include programmed instruction sequences for system initialization and operation, code conversions and look-up tables. A storage cell in ROM, at the intersection of row and column, typically stores one bit of information. Most integrated circuit ROMs utilize the presence or absence of a transistor at a row-column junction to represent a binary digit, one or zero.

As memories increase in size, semiconductor technology has evolved to produce more transistors per unit area of semiconductor chip. As the number of transistors per unit area of semiconductor chip has increased, ROM density has also increased. It is desirable to have even higher densities of information storage. Multiple-level ROM disclosed in U.S. Pat. Re. No. 32,401 is capable of storing twice as much information per unit area as conventional FET binary ROM. To provide multiple level outputs, each memory cell transistor has either the threshold voltage adjusted by ion implantation, or the cross-sectional area of the transistor channel selected from one of $2^n$ preselected values to provide multiple level outputs. Multiple level outputs produced by such transistors must be decoded to ascertain the corresponding bits represented by the output of a particular memory cell transistor. To achieve the encoding, sense amplifiers have typically required one less reference level than the number of possible multiple level outputs.

SUMMARY OF THE INVENTION

In accordance with the present invention, an integrated circuit includes a sense amplifier. The sense amplifier is capable of encoding $2^n$ levels of output characteristic into a bit pattern of n corresponding bits. The sense amplifier includes a non-zero detect circuit for detecting when the output characteristic is zero. The sense amplifier also includes $2^n-2$ comparators for comparing an output characteristic to $2^n-2$ reference levels when the output characteristic is non-zero. The $2^n-2$ reference levels are constructed from $2^n-2$ non-zero levels of the $2^n$ possible levels of output characteristic. An encoder is coupled to the non-zero detect circuit and the comparators. The encoder encodes the output from the non-zero detect circuit and the outputs from the comparators to corresponding predetermined bit patterns. When the output characteristic is determined to be zero by the non-zero detect circuit, the bit pattern output is a default bit pattern. When the output characteristic is non-zero, the bit pattern takes on predetermined values determined by which pair of reference levels the output falls between, or whether the output characteristic is greater than the largest reference level or less than the smallest reference level.

DETAILED DESCRIPTION

Figure 1:
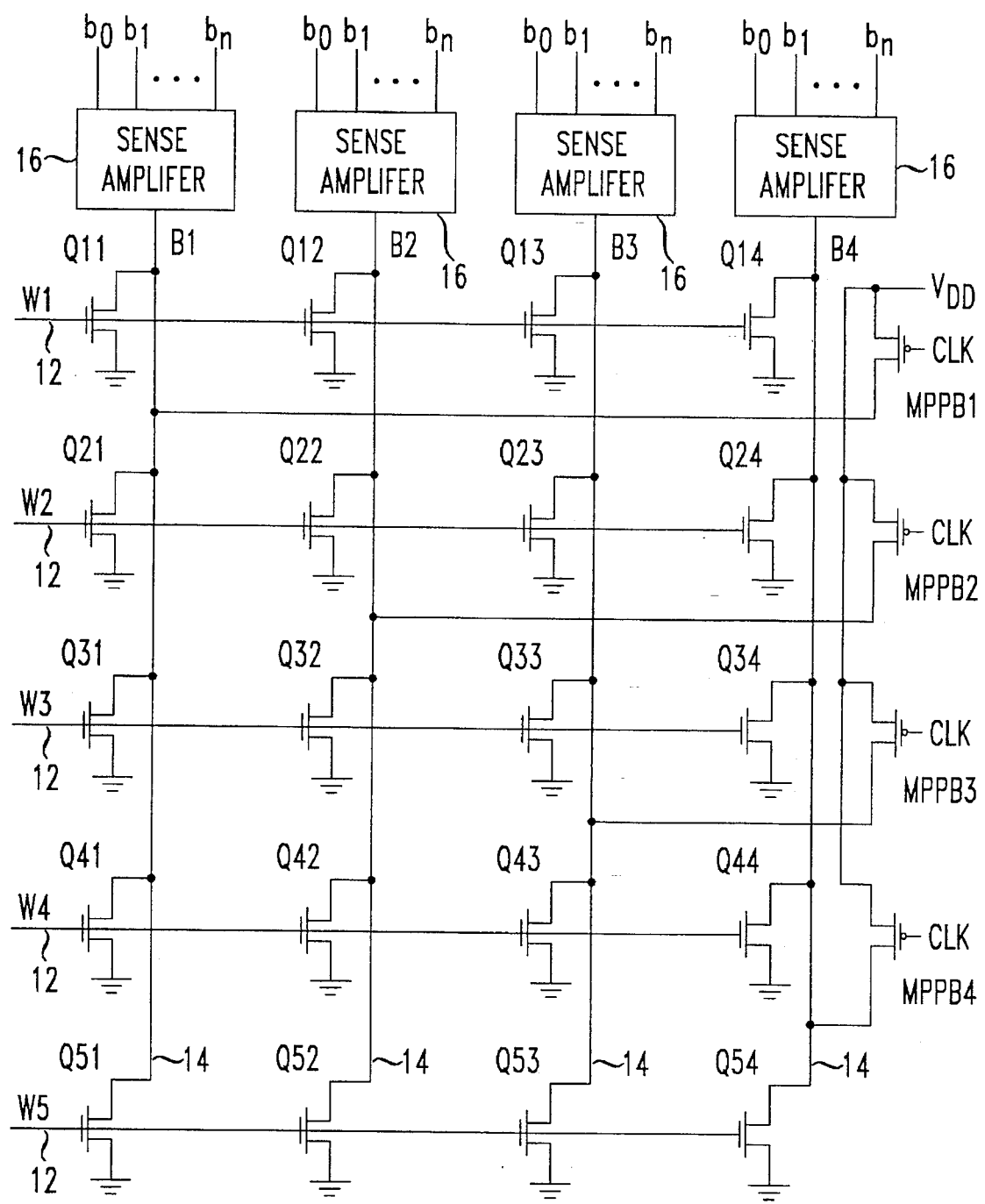
FIG. 1 is a schematic diagram illustrating a portion of a read-only memory array showing the binary input on word lines (shown horizontally) and the multiple level output on bit lines (shown vertically)

The schematic diagram of a ROM 10 incorporating an illustrative embodiment of the present invention is shown in FIG. 1. ROM 10 stores information in transistor storage elements, or cells, and upon receipt of a transition on a word line, provides outputs on bit lines to the respective sense amplifiers.

ROM 10 is illustrated as a portion of the read-only memory comprised of transistor storage elements. The transistor storage elements are labeled with a matrix notation Qij, where fi is the number of the row in the array and j is the number of the column in the array. In the portion of a read-only memory shown, the transistor storage elements are designated Q11 through Q54. Each transistor storage element represents a cell in ROM 10.

Word lines 12, labeled W1 through W5, each enable the gate electrode of a row of transistor storage elements. The transistor storage elements are shown with their source terminal electrically coupled to ground potential, and their drain terminal commonly connected to an output bit line 14, labeled B1 through B4. Each bit line 14 is connected to a clock driven line, CLK, through a respective precharge transistor MPPB1 through MPPB4. Each transistor storage element can provide an electrical characteristic having one of n predetermined levels. The electrical characteristic can be either current or voltage. In the illustrative embodiment, current is the electrical characteristic employed as the input to sense amplifiers 16.

Bit lines 14 are coupled as the inputs to respective sense amplifiers 16. Sense amplifier 16 is a current mode sense amplifier. Sense amplifiers 16 each provide $2^n-2$ inputs to an encoder 18 that encodes the $2^n-2$ levels to a corresponding binary representation of n bits.

Either current or voltage may be used as the characteristic output from a transistor storage element Qij. Transistor storage elements providing current as the output characteristic each produce one of $2^n-1$ current levels. The $2^n$th current level is no current which is obtained by no connection between a transistor storage element Qij (or no transistor storage element) and a bit line 14. Transistor storage elements Qij that produce voltage as the characteristic output produce $2^n-1$ voltage levels. The $2^n$th voltage level is the precharge voltage level. The channel of each transistor storage element Qij may be doped to one of $2^n-1$ preselected doping levels selected from one of $2^n-1$ predetermined doping values to provide $2^n-1$ predetermined threshold voltage levels. Transistor storage elements Qij that produce a voltage as the output characteristic may have their output encoded to a corresponding current for for use in sense amplifier 16.

Figure 2:
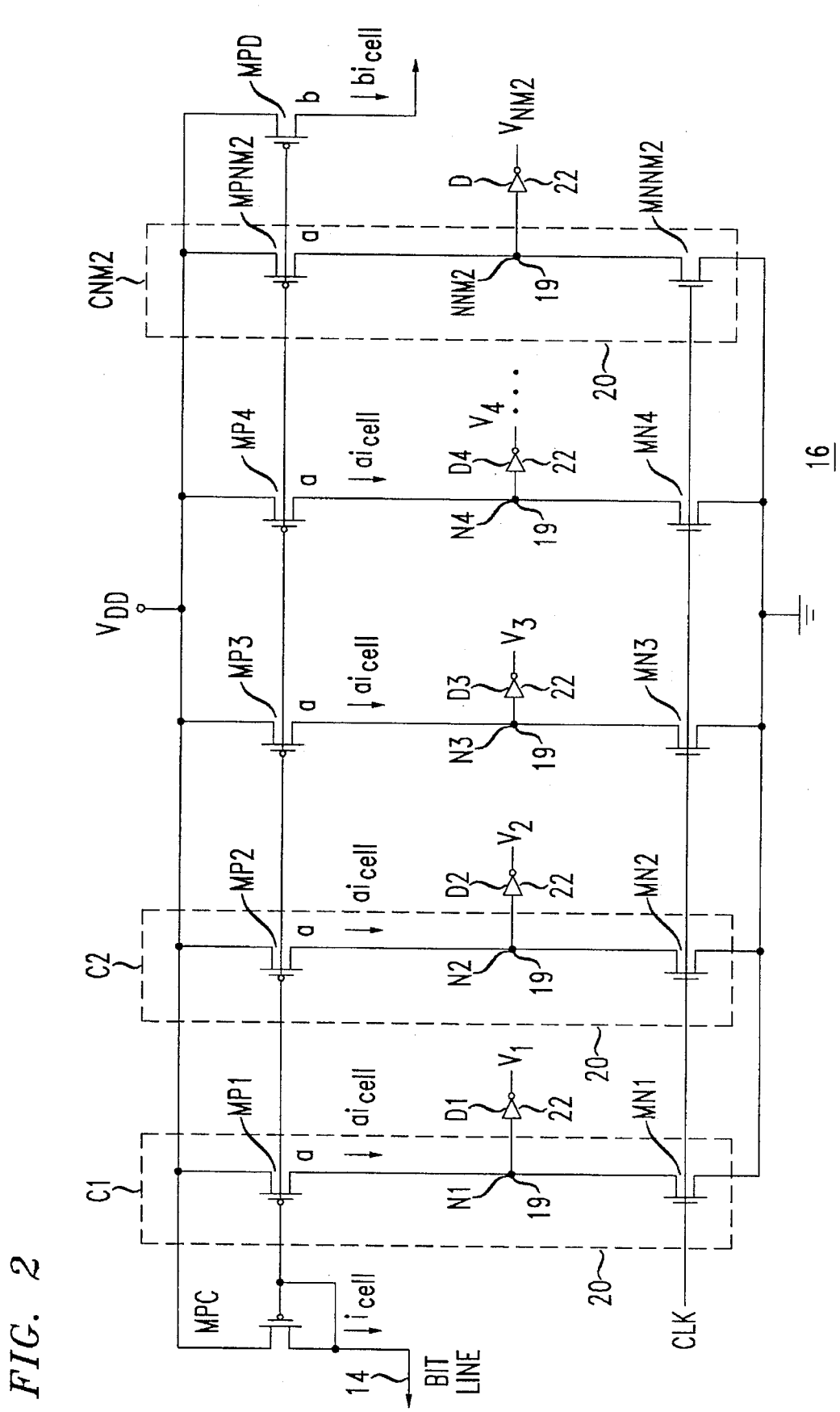
FIG. 2 is a schematic diagram of an illustrative embodiment of a sense amplifier for use with multiple level ROM.

A schematic diagram of a portion an illustrative sense amplifier 16 is shown in FIG. 2. Sense amplifier 16 establishes n-2 references to which the current from a cell is compared. The current from a cell is compared to the n-2 references to determine whether the current is greater than the largest reference, smaller than the smallest reference, or which two references the current from a cell is between.

Each transistor pair, MP1, MN1; MN2, MP2; through MNNM2, MPNM2, coupled between $V_{DD}$ and a reference potential such as ground is a comparator 20, labeled C1 through CNM2. Transistor MPC is coupled as a current mirror with respect to each of transistors MP1, MP2, MP3 through MPNM2 and MPD. In each comparator the current mirror replicates the current, $i_{cell}$, of a bit line 14 multiplied by parameter "a" (described below) coupled to sense amplifier 16. Each of the n-channel transistors MN1, MN2, through MNNM2 are driven by clock signal CLK and are sized identically to a respective one of the transistor storage elements Qij that produces one of the $2^n-1$ current levels. For example, MN1 may provide the smallest non-zero current, MN2 the second from the smallest current, and MNNM2 next to the largest current. The transistor storage element Qij producing the largest current is not replicated in a comparator. Since the transistor storage element Qij producing the largest current is not replicated in a comparator, there are $2^n-2$ comparators 20 each having a transistor MP1, MP2, through MPNM2 in current mirror operation with transistor MPC to duplicate current $i_{cell}$ in each comparator.

Each comparator 20 is a current comparator. Each comparator includes an n-channel transistor and a p-channel transistor. The source of the p-channel transistor is coupled to $V_{DD}$. The drain of the p-channel transistor is coupled to the drain of the n-channel transistor to form a node. Nodes 19, denoted N1 through NNM2, are formed respectively in comparators C1 through CNM2. The source of the n-channel transistor is coupled to a reference potential such as ground. Each n-channel transistor, MN1 through MNNM2, coupled to node 19 provides one of the $2^n-2$ current reference levels. The current provided from a cell of ROM 10 is multiplied by a in each comparator by the p-channel transistor, in current mirror operation with transistor MPC, and is provided to the node associated with the p-channel transistor. If the current provided to the node by the p-channel transistor in a comparator is greater than the current removed from the node by the n-channel transistor in the comparator, the node will be pulled high. Conversely, if the current provided to the node by the p-channel transistor in a comparator is less than the current removed from the node by the n-channel transistor in the comparator, the node will be pulled low.

Figure 5:
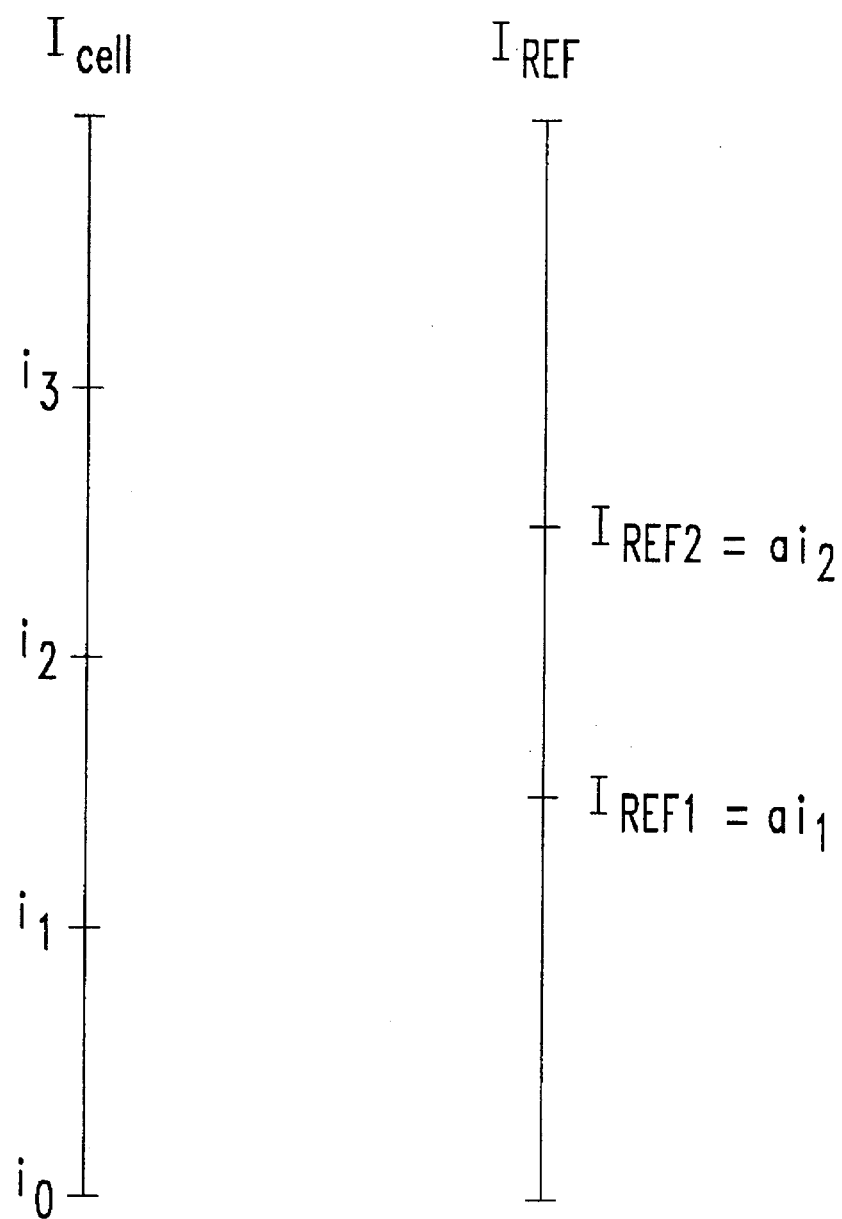
FIG. 5 is a diagram of cell current and the corresponding reference current.

Each node N1 through NNM2 provides a current reference level. A high-input impedance inverting driver 22, denoted D1 through DNM2, provides a respective node voltage V1 through VNM2 at its output. Ideally the current reference levels should be half-way between the $2^n$ current levels produced by the transistor storage elements. The current reference level at respective nodes N1 through NNM2 can be a shifted current value half-way between the current levels produced by the transistor storage elements and can be achieved in several ways. As shown in FIG. 2, the size of transistors MP1 through MPNM2 can be a times larger than the size of transistor MPC, thus providing a current to node 19 of each comparator that is a times $i_{cell}$. The reference currents achieved by this method are shown in FIG. 5 for the case n=2. The four current values produced by the various transistor storage elements Qij are denoted $i_0$, $i_1$, $i_2$ and $i_3$, from the smallest to the largest. The smallest current, $i_0$, along with its corresponding reference current indicates no current. $I_{REF1}$ is a current value corresponding to a times $i_1$ and is approximately half-way between the magnitudes of $i_1$ and $i_2$. Similarly, $I_{REF2}$ is a current value corresponding to a times current $i_2$ and is approximately half-way between the magnitude of $i_2$ and $i_3$. As stated above, the largest current value is not replicated in a comparator. Therefore, there is no need to provide a reference level corresponding to current $i_3$.

Alternatively, the size of transistors MN1, MN2, through MNNM2 could be a factor of a times larger than the size of the corresponding transistor storage element to produce a shifted current reference. The former method is preferred so the same mask size can be used in fabricating the integrated circuit for transistor storage elements as for "reference" transistors MN1, MN2, through MNNM2.

Figure 3:
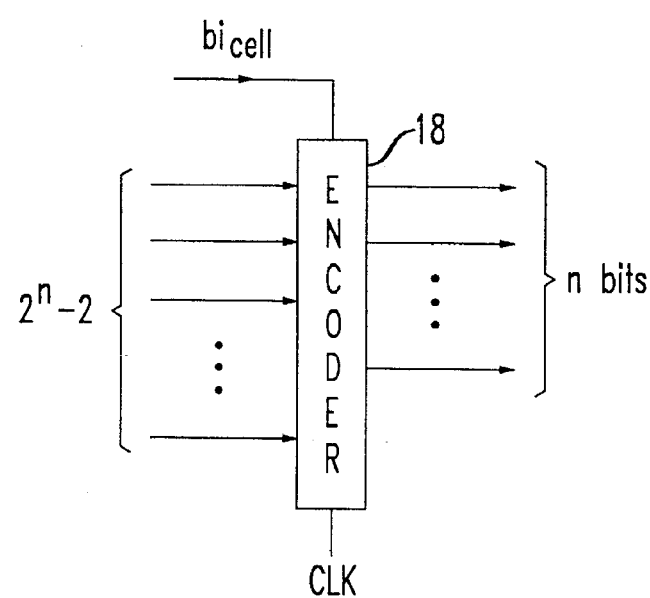
FIG. 3 is a block diagram of an encoder for encoding $2^n-2$ levels to n bits.

An encoder 18 for encoding $2^n-2$ current level inputs to n bits is shown in FIG. 3. Each of the voltages V1 through VNM2 produced by the non-inverting drivers D1 through DNM2 provide n-2 inputs to an encoder 18. Encoder 18 is a part of sense amplifier 16. If $i_{cell}$ is zero, a default bit pattern of n bits is provided at the output of an encoder 18 by a non-zero detect circuit. If the current from a cell is non-zero, the encoder is enabled to provide an encoder bit pattern of n bits as an output.

The output current produced by transistor MPD (FIGS. 2 and 4) is also input to an encoder 18. Since transistor MPD operates as current mirror in conjunction with transistor MPC, the magnitude of current produced by transistor MPD is proportional to $i_{cell}$ by multiplier b. Multiplier b may take on any value to make an encoder 18 operate.

Figure 4:
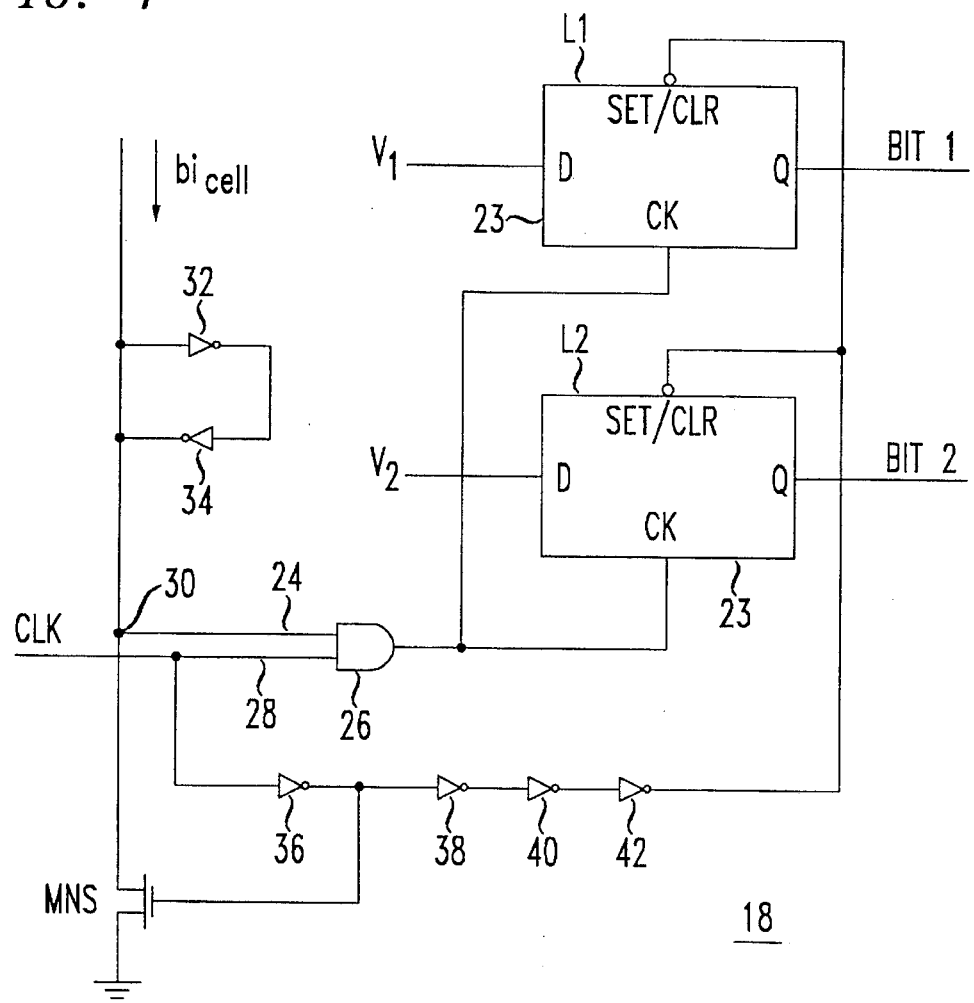
FIG. 4 is a schematic diagram of an illustrative embodiment of an encoder for the case n=2.

A schematic diagram of an illustrative embodiment of an encoder 18 for the case n equals 2 is shown in FIG. 4. Encoder 18 is comprised of n latches 23, denoted L1 through LNM2, in this case L1 through L2. The input to each latch L1 through L2 is a logic high or logic low signal respectively produced by drivers V1 through VNM2, in this case V1 through V2. Current b $i_{cell}$ generated by transistor MPD provides a first input 24 to AND gate 26. When current b $i_{cell}$ is non-zero, node 30 charges to $V_{DD}$ thereby providing a logic high to the first input 24, latching node 30 high by inverters 32 and 34, and allowing the clock signal, CLK, on second input 28 of AND gate 26 to pass through AND gate 26. The output of AND gate 26 is coupled to the clock input of each latch 23. Latches 23 then clock respective inputs V1 through V2 to the output, thereby providing bit 1 through bit n, in this case two, as the encoded bit pattern output.

When the clock signal, CLK, on second input 28 of AND gate 26 goes low, the output of a series of inverters 36, 38, 40 and 42 each change state. The output of inverter 36 grounds node 30 unlatching inverters 32 and 34 and driving the first input 24 to AND gate 26 to a logic low. This prevents clock signal CLK from passing through AND gate 26 until node 30 again is a logic high. Inverters 36, 38, 40 and 42 introduce a time delay, and while four inverters are shown, the number present may differ. The output of the last inverter in the series, inverter 42, sets or clears each of the latches 23. This sets up the default bit pattern produced at the output of latches 23 for the default condition when $i_{cell}$ is zero. When $i_{cell}$ is zero, b $i_{cell}$ is also zero. Node 30 remains low so the output of AND gate 26 also remains low. Latches 23 are unclocked and the default bit pattern previously established is provided at the output of latches 23.

The bit pattern produced at the output of latches 23 is arbitrary. Each current level corresponds to n bits of output uniquely mapped. The bit pattern that requires the least current or the least number of devices may be precoded into the cells of ROM to result in data that is meaningful.

In operation, to transfer a particular word out of ROM, the bit lines are precharged to a logic high. When clock signal CLK is a logic low, a word line is transitioned to a logic high. All other word lines remain in a logic low state. The bit lines provide inputs from the row of cells in which the word line is high to respective sense amplifiers. The transistor storage elements either have a connection or have no connection to a respective bit line 14. When the word line is transitioned to a logic high, if there is no connection from a transistor storage element to a bit line 14, a logic high is outputted on the bit line to a sense amplifier. If there is a connection, the bit line provides one of the $2^n$-1 non-zero current levels as an input to a respective sense amplifier. Node 30 is a logic low which sets up the default bits produced at the outputs of latches 23. Transistors MN1 through MNNM2 are turned off so there is no current flowing in sense amplifier 16.

When clock signal CLK transitions to a logic high, a logic high is provided to the second input 28 of AND gate 26. In addition, each cell having a word line that is a logic high is clocked. Transistors MN1 and through MNNM2 are turned on by clock signal CLK. Drivers D1 through DNM2 resolve their output states, respectively V1 through VNM2. If current $i_{cell}$ is non-zero, node 30 charges to $V_{DD}$ thereby providing a logic high to the other input, input 24, of AND gate 26. Inverters 32 and 34 latch node 30 to a logic high. The clock signal, CLK, is thus able to pass through AND gate 26. Latches 23 clock V1 though VNM2 to their respective outputs in an encoder 18 to provide an encoded bit pattern as the output of an encoder 18 and latches 23. The bit pattern is also the output of sense amplifiers 16. If $i_{cell}$ is zero, clock signal CLK is unable to pass through AND gate 26, latches 23 remain unclocked, and a previously established default bit pattern is presented at the outputs of the latches and also the output of the sense amplifiers.

Sense amplifier 16 implements a current comparison. For the case n=2 the logic is a follows: If $i_{cell}$ is zero, a predetermined default bit pattern is presented. If $i_{cell}$ is non-zero, it is known that the current represents $i_1$ $i_2$ or $i_3$. Thus, current $i_{cell}$ is compared to reference current $I_{REF1}$ (see FIG. 5). If $i_{cell}$ is less than $I_{REF1}$, $i_{cell}$ must be $i_1$ and the comparison is complete. A predetermined bit pattern corresponding to $i_1$ is provided as the output of the sense amplifier.

If $i_{cell}$ is greater than $I_{REF1}$, whether $i^{cell}$ is $i_2$ or $i_3$ is determined by whether $i_{cell}$ is greater than or less than $I_{REF2}$. Once this comparison is made the bit pattern corresponding to $i_2$ or $i_3$, as determined by the comparison, is produced as the output. Thus, for n equal to two, only two current reference levels and a non-zero detect circuit are required to determine which one of four ($2^n$) current levels is generated by a cell. This can be generalized to $2^n$-2 current reference levels and a non-zero detect circuit to determine which one of $2^n$ current levels is generated by a cell.

I claim:

1. An integrated circuit including a sense amplifier, the sense amplifier for encoding $2^n$ levels of output characteristic into n corresponding bit patterns, the sense amplier comprising:

a non-zero detect circuit for detecting when the output characteristic is zero, the non-zero detect circuit providing an output;

$2^n$-2 comparators for comparing an output characteristic to $2^n$-2 reference levels when the output characteristic is non-zero, the $2^n$-2 reference levels constructed from $2^n$-2 non-zero levels of the $2^n$ possible levels of output characteristic, each of the comparators providing an output; and an encoder coupled to the non-zero detect circuit and the comparators for encoding the output from the non-zero detect circuit and the output from the comparators to a corresponding one of the n bit patterns, the corresponding bit pattern providing an output from the sense amplifier, the bit pattern being a predetermined default bit pattern when the output characteristic is determined to be zero by the non-zero detect circuit, when the output characteristic is non-zero the bit pattern taking on predetermined values determined by which pair of reference levels the output falls between, or whether the output characteristic is greater than the largest reference level or is less than the smallest reference level, whereby only $2^n$-2 reference levels are required to encode $2^n$ levels of an output characteristic.

2. A integrated circuit as recited in claim 1, wherein the output characteristic is current.

3. A integrated circuit as recited in claim 1, wherein the comparators are each comprised of a first transistor and a second transistor, each of the first transistors being in current mirror operation with a transistor duplicating the output characteristic so as to replicate the output characteristic in each comparator, each of the first transistors being larger than the transistor producing the output characteristic by a factor.

4. An integrated circuit comprising:

a read-only memory having cells in which information storage is provided, each cell representing one set of a plurality of sets of n bits of information, each cell being capable of providing an electrical characteristic corresponding to said one set of n bits;

a sense amplifier coupled to at least one cell to receive the electrical characteristic from said at least one cell, the sense amplifier for comparing the electrical characteristic of non-zero to $2^n$-2 reference levels to determine which two of the $2^n$-2 reference levels the electrical characteristic is between, or whether the electrical characteristic is greater than the largest reference level or is less than the smallest reference level, the sense amplifier providing an output indicative of the two of the $2^n$-2 reference levels the electrical characteristic is between, or that the electrical characteristic is greater than the largest reference level or is less than the smallest reference level, and no output if the electrical characteristic is zero; and an encoder coupled to receive the output from the sense amplifier, the encoder for generating a predetermined set of n bits if the electrical characteristic is zero, and when the electrical characteristic is non-zero for generating a predetermined set of n bits corresponding to the output of the sense amplifier.

5. The integrated circuit as recited in claim 4, wherein the read-only memory comprises rows and columns of cells, the at least one cell coupled to the sense amplifier being a column of cells.

6. The integrated circuit as recited in claim 4, wherein the number of bits of information stored by each cell is two such that n=2, resulting in two reference levels in the sense amplifier.

7. The integrated circuit as recited in claim 4, wherein the electrical output of each cell is current.

8. The integrated circuit as recited in claim 7, wherein each cell comprises a field effect transistor having a channel, the cross-sectional area of the channel being selected from one of $2^n$ preselected values to provide an electrical output corresponding to said one set of n bits.

9. The integrated circuit as recited in claim 4, wherein the electrical characteristic output of each cell is voltage.

10. The integrated circuit as recited in claim 8, wherein each cell comprises a field effect transistor having a channel, the channel being doped to one of $2^n$ preselected doping levels to provide an electrical characteristic output corresponding to said one set of n bits.

11. An integrated circuit as recited in claim 4, wherein the read-only-memory is erasable.

* * * * *